(12) United States Patent
Lyne

(10) Patent No.: US 6,689,634 B1
(45) Date of Patent: *Feb. 10, 2004

(54) MODELING TECHNIQUE FOR SELECTIVELY DEPOPULATING ELECTRICAL CONTACTS FROM A FOOT PRINT OF A GRID ARRAY (BGA OR LGA) PACKAGE TO INCREASE DEVICE RELIABILITY

(75) Inventor: Kevin Lyne, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/400,811

(22) Filed: Sep. 22, 1999

(51) Int. Cl.[7] .......................... H01L 21/44; H01L 21/48
(52) U.S. Cl. .................. 438/106; 438/598; 438/612; 361/760
(58) Field of Search ................. 438/598, 106, 438/612; 716/12, 15; 700/121; 703/1, 2; 361/718, 719, 720, 803, 783, 777, 767; 174/261

(56) References Cited

U.S. PATENT DOCUMENTS

| | | | | |
|---|---|---|---|---|
| 4,437,141 A | * | 3/1984 | Prokop ........................ | 361/771 |
| 4,495,377 A | * | 1/1985 | Johnson et al. ............. | 174/268 |
| 5,216,278 A | * | 6/1993 | Lin et al. ..................... | 257/688 |
| 5,324,985 A | * | 6/1994 | Hamada et al. ............ | 257/697 |
| 5,424,492 A | * | 6/1995 | Petty et al. .................. | 174/250 |
| 5,491,364 A | * | 2/1996 | Brandenburg et al. ...... | 257/786 |
| 5,610,833 A | * | 3/1997 | Chang et al. ................ | 716/11 |
| 5,627,405 A | * | 5/1997 | Chillara ....................... | 257/668 |
| 5,729,894 A | * | 3/1998 | Rostoker et al. ............ | 257/693 |
| 5,885,855 A | * | 3/1999 | Liang .......................... | 438/128 |
| 6,071,801 A | * | 6/2000 | Wachtler et al. ............ | 438/612 |
| 6,194,782 B1 | * | 2/2001 | Katchmar ................... | 257/738 |
| 6,285,560 B1 | * | 9/2001 | Lyne ........................... | 361/760 |

OTHER PUBLICATIONS

Rozenblit et al., "Towards a VLSI Packaging Design Support Environment (PDSE); Concepts and Implementation", IEEE International Conf. on Computer Design: VLSI in Comp. and Processors, Sep. 17–19, 1990, pp. 443–448.*
Blood et al., "Early Analysis of Chip Scale Package Design Trade–offs", IEEE Symposium on IC/Package Design Integration, Feb. 2–3, 1998, pp. 64–69.*
Lindsey et al., "JACS–Pak/sup TM/ Flip–Chip Scale Package Development and Characterization", 48th IEEE Electronic Components & Tech. Conf., May 25–28, 1998, pp. 511–517.*

* cited by examiner

Primary Examiner—Matthew Smith
Assistant Examiner—Lex H. Malsawma
(74) Attorney, Agent, or Firm—Ronald O. Neerings; Wade James Brady, III; Frederick J. Telecky, Jr.

(57) ABSTRACT

A modeling technique for selectively depopulating solder balls (12) (and their respective solder ball pads (34), vias (32) and traces or lines (30)) from a conventional foot print of a ball grid array (BGA) package, or land grid array package (LGA) to improve device reliability. The modeling technique anticipates a routing of traces through the gap resulting from the depopulated solder balls or lands as additional space for routing traces or lines from solder ball or land pads to an exterior surface of a substrate (14) upon which a semiconductor die (20) is mounted. An advantage of the present invention is that it permits the retention of an optimum via diameter while increasing the number of solder balls or lands on ever shrinking packages, thereby increasing device reliability.

31 Claims, 9 Drawing Sheets

FIG. 7

THIS IS THE 151GHZ CASE (152-ONE BALL IN A1 CORNER NOT SHOWN BELOW).
THE DESIGN RULE USED FOR THIS PACKAGE WAS LINE/SPACE 28/42.

0.50mm PITCH–LARGEST POSSIBLE MATRIX WITH N−1 ROW DEPOPULATED    18UM RULE–LINE/SPACE 20/30
                                                                 25UM RULE–LINE/SPACE 28/42

| | | |
|---|---|---|
| VIACAP RULE | 50 | um | OVERLAP OF VIACAP FROM EDGE OF VIA |
| BODY | 10 | mm | *ASSUMED RELATIVE TO STANDARD VIAS |
| MATRIX | 18 | | |
| BALL PITCH | 500 | um | |

TOTAL 152

| ROW N− | BALLSITES/ ROW | BALLS DEPOP PER SIDE | REMAINING BALLS ON ROW | NUMBER OF REDUCED SIZE VIAS/SIDE | STANDARD VIA SIZE (um) | REDUCED VIA SIZE (um) | LINE WIDTH (um) | SPACE WIDTH (um) | TRACES BETWEEN STANDARD VIAS | TRACES PER REDUCED VIA | TRACES PER DEPOP BALL* | MAX TRACES (BALLS INSIDE) | MAX TRACES OK? | TOTAL POSSIBLE BALLS | ACTUAL BALLS INSIDE | DELTA |
|---|---|---|---|---|---|---|---|---|---|---|---|---|---|---|---|---|
| 0 | 68 | 6 | 44 | 0 | 280 | 280 | 28 | 42 | 1 | 1 | 8 | 212 | 44 | 44 | 108 | 104 |
| 1 | 60 | 14 | 4 | 0 | 280 | 280 | 28 | 42 | 1 | 1 | 8 | 396 | 4 | 4 | 104 | 292 |
| 2 | 52 | 0 | 52 | 0 | 280 | 280 | 28 | 42 | 1 | 1 | 8 | 52 | 52 | 52 | 52 | 0 |
| 3 | 44 | 0 | 44 | 0 | 280 | 280 | 28 | 42 | 1 | 1 | 8 | 44 | 44 | 44 | 8 | 36 |
| 4 | 36 | 7 | 8 | 0 | 280 | 280 | 28 | 42 | 1 | 1 | 8 | 204 | 8 | 8 | 0 | 204 |
| 5 | 28 | 7 | 0 | 0 | 280 | 280 | 28 | 42 | 1 | 1 | 8 | 196 | 0 | 0 | 0 | 196 |
| 6 | 20 | 5 | 0 | 0 | 280 | 280 | 28 | 42 | 1 | 1 | 8 | 140 | 0 | 0 | 0 | 140 |
| 7 | 12 | 3 | 0 | 0 | 280 | 280 | 28 | 42 | 1 | 1 | 8 | 84 | 0 | 0 | 0 | 84 |
| 8 | 4 | 1 | 0 | 0 | 280 | 280 | 28 | 42 | 1 | 1 | 8 | 28 | 0 | 0 | 0 | 28 |
| 9 | 0 | 0 | 0 | 0 | 280 | 280 | 28 | 42 | 1 | 1 | 8 | 0 | 0 | 0 | 0 | 0 |
| 10 | 0 | 0 | 0 | 0 | 280 | 280 | 28 | 42 | 1 | 1 | 8 | 0 | 0 | 0 | 0 | 0 |

TOTAL 152    TRUE TOTAL 152

*ASSUMED RELATIVE TO STANDARD VIAS

FIG. 10

0.50mm PITCH-LARGEST POSSIBLE MATRIX WITH N-1 ROW DEPOPULATED

| | | |
|---|---|---|
| VIACAP RULE | 50 um | 18UM RULE-LINE/SPACE 20/30 |
| BODY | 10 mm | 25UM RULE-LINE/SPACE 28/42 |
| MATRIX | 17 | TOTAL 240 |
| BALL PITCH | 500 um | |

OVERLAP OF VIACAP FROM EDGE OF VIA
*ASSUMED RELATIVE TO STANDARD VIAS

| ROW N- | BALLSITES/ROW | BALLS DEPOP PER SIDE | REMAINING BALLS ON ROW | NUMBER OF REDUCED SIZE VIAS/SIDE | STANDARD VIA SIZE (um) | REDUCED VIA SIZE (um) | LINE WIDTH (um) | SPACE WIDTH (um) | TRACES BETWEEN STANDARD VIAS | TRACES PER REDUCED VIA | TRACES PER DEPOP BALL* | MAX TRACES (BALLS INSIDE) | MAX TRACES OK? | TOTAL POSSIBLE BALLS | ACTUAL BALLS INSIDE | DELTA |
|---|---|---|---|---|---|---|---|---|---|---|---|---|---|---|---|---|
| 0 | 64 | 3 | 52 | 0 | 280 | 280 | 18 | 28 | 2 | 2 | 12 | 224 | 52 | 52 | 188 | 36 |
| 1 | 56 | 2 | 48 | 0 | 280 | 280 | 18 | 28 | 2 | 2 | 12 | 176 | 48 | 48 | 140 | 36 |
| 2 | 48 | 2 | 40 | 0 | 280 | 280 | 18 | 28 | 2 | 2 | 12 | 160 | 40 | 40 | 100 | 60 |
| 3 | 40 | 1 | 36 | 0 | 280 | 280 | 18 | 28 | 2 | 2 | 12 | 112 | 36 | 36 | 64 | 48 |
| 4 | 32 | 0 | 32 | 0 | 280 | 280 | 18 | 28 | 2 | 2 | 12 | 64 | 32 | 32 | 32 | 32 |
| 5 | 24 | 0 | 24 | 0 | 280 | 280 | 18 | 28 | 2 | 2 | 12 | 48 | 24 | 24 | 8 | 40 |
| 6 | 16 | 4 | 0 | 0 | 280 | 280 | 18 | 28 | 2 | 2 | 12 | 160 | 0 | 0 | 8 | 152 |
| 7 | 8 | 0 | 8 | 0 | 280 | 280 | 18 | 28 | 2 | 2 | 12 | 16 | 8 | 8 | 0 | 16 |
| 8 | 0 | 0 | 0 | 0 | 280 | 280 | 18 | 28 | 2 | 2 | 12 | 0 | 0 | 0 | 0 | 0 |
| 9 | 0 | 0 | 0 | 0 | 280 | 280 | 18 | 28 | 2 | 2 | 12 | 0 | 0 | 0 | 0 | 0 |
| 10 | 0 | 0 | 0 | 0 | 280 | 280 | 18 | 28 | 2 | 2 | 12 | 0 | 0 | 0 | 0 | 0 |
| TOTAL 240 | | | | | | | | | | | | TRUE TOTAL 240 | | | | |

*ASSUMED RELATIVE TO STANDARD VIAS

FIG. 12

0.50mm PITCH-LARGEST POSSIBLE MATRIX WITH N-1 ROW DEPOPULATED

| | | |
|---|---|---|
| VIACAP RULE | 50 | um |
| BODY | 12 | mm |
| MATRIX | 21 | |
| BALL PITCH | 500 | um |

18UM RULE-LINE/SPACE 20/30
25UM RULE-LINE/SPACE 28/42

TOTAL 288

OVERLAP OF VIACAP FROM EDGE OF VIA
*ASSUMED RELATIVE TO STANDARD VIAS

| ROW N- | 0 | 1 | 2 | 3 | 4 | 5 | 6 | 7 | 8 | 9 | 10 | |
|---|---|---|---|---|---|---|---|---|---|---|---|---|
| BALLSITES/ROW | 80 | 72 | 64 | 56 | 48 | 40 | 32 | 24 | 16 | 8 | 0 | TOTAL 288 |
| BALLS DEPOP PER SIDE | 8 | 1 | 0 | 0 | 12 | 10 | 1 | 0 | 4 | 2 | 0 | |
| REMAINING BALLS ON ROW | 48 | 68 | 64 | 56 | 0 | 0 | 28 | 24 | 0 | 0 | 0 | |
| NUMBER OF REDUCED SIZE VIAS/SIDE | 0 | 0 | 0 | 0 | 0 | 0 | 0 | 0 | 0 | 0 | 0 | |
| STANDARD VIA SIZE (um) | 280 | 280 | 280 | 280 | 280 | 280 | 280 | 280 | 280 | | | |
| REDUCED VIA SIZE (um) | 280 | 280 | 280 | 280 | 280 | 280 | 280 | 280 | 280 | | | |
| LINE WIDTH (um) | 18 | 18 | 18 | 18 | 18 | 18 | 18 | 18 | 18 | | | |
| SPACE WIDTH (um) | 28 | 28 | 28 | 28 | 28 | 28 | 28 | 28 | 28 | | | |
| TRACES BETWEEN STANDARD VIAS | 2 | 2 | 2 | 2 | 2 | 2 | 2 | 2 | 2 | | | |
| TRACES PER REDUCED VIA | 2 | 2 | 2 | 2 | 2 | 2 | 2 | 2 | 2 | | | |
| TRACES PER DEPOP BALL* | 12 | 12 | 12 | 12 | 12 | 12 | 12 | 12 | 12 | | | |
| MAX TRACES (BALLS INSIDE) | 416 | 176 | 128 | 112 | 480 | 400 | 96 | 48 | 160 | 80 | 0 | TRUE TOTAL 288 |
| MAX TRACES OK? | 48 | 68 | 64 | 56 | 0 | 0 | 28 | 24 | 0 | 0 | 0 | |
| TOTAL POSSIBLE BALLS | 48 | 68 | 64 | 56 | 0 | 0 | 28 | 24 | 0 | 0 | 0 | |
| ACTUAL BALLS INSIDE | 240 | 172 | 108 | 52 | 52 | 52 | 24 | 0 | 0 | 0 | | |
| DELTA | 176 | 4 | 20 | 60 | 428 | 348 | 72 | 48 | 160 | 80 | 0 | |

FIG. 14

0.50mm PITCH-LARGEST POSSIBLE MATRIX WITH N-1 ROW DEPOPULATED

| | | |
|---|---|---|
| VIACAP RULE | 50 um | 18UM RULE-LINE/SPACE 20/30 |
| BODY | 12 mm | 25UM RULE-LINE/SPACE 28/42 |
| MATRIX | 21 | TOTAL 240 |
| BALL PITCH | 500 um | OVERLAP OF VIACAP FROM EDGE OF VIA |
| | | *ASSUMED RELATIVE TO STANDARD VIAS |

| ROW N- | BALLSITES/ROW | BALLS DEPOP PER SIDE | REMAINING BALLS ON ROW | NUMBER OF REDUCED SIZE VIAS/SIDE | STANDARD VIA SIZE (um) | REDUCED VIA SIZE (um) | LINE WIDTH (um) | SPACE WIDTH (um) | TRACES BETWEEN STANDARD VIAS | TRACES PER REDUCED VIA | TRACES PER DEPOP BALL | MAX TRACES (BALLS INSIDE) | MAX TRACES OK? | TOTAL POSSIBLE BALLS | ACTUAL BALLS INSIDE | DELTA |
|---|---|---|---|---|---|---|---|---|---|---|---|---|---|---|---|---|
| 0 | 80 | 8 | 48 | 0 | 280 | 280 | 18 | 28 | 2 | 2 | 12 | 416 | 48 | 48 | 192 | 224 |
| 1 | 72 | 1 | 68 | 0 | 280 | 280 | 18 | 28 | 2 | 2 | 12 | 176 | 68 | 68 | 124 | 52 |
| 2 | 64 | 2 | 56 | 0 | 280 | 280 | 18 | 28 | 2 | 2 | 12 | 192 | 56 | 56 | 68 | 124 |
| 3 | 56 | 4 | 40 | 0 | 280 | 280 | 18 | 28 | 2 | 2 | 12 | 240 | 40 | 40 | 28 | 212 |
| 4 | 48 | 12 | 0 | 0 | 280 | 280 | 18 | 28 | 2 | 2 | 12 | 480 | 0 | 0 | 28 | 452 |
| 5 | 40 | 10 | 0 | 0 | 280 | 280 | 18 | 28 | 2 | 2 | 12 | 400 | 0 | 0 | 28 | 372 |
| 6 | 32 | 1 | 28 | 0 | 280 | 280 | 18 | 28 | 2 | 2 | 12 | 96 | 28 | 28 | 0 | 96 |
| 7 | 24 | 6 | 0 | 0 | 280 | 280 | 18 | 28 | 2 | 2 | 12 | 240 | 0 | 0 | 0 | 240 |
| 8 | 16 | 4 | 0 | 0 | 280 | 280 | 18 | 28 | 2 | 2 | 12 | 160 | 0 | 0 | 0 | 160 |
| 9 | 8 | 2 | 0 | 0 | 280 | 280 | 18 | 28 | 2 | 2 | 12 | 80 | 0 | 0 | 0 | 80 |
| 10 | 0 | 0 | 0 | 0 | 280 | 280 | 18 | 28 | 2 | 2 | 12 | 0 | 0 | 0 | 0 | 0 |
| | TOTAL 240 | | | | | | | | | | | TRUE TOTAL 240 | | | TOTAL 240 | |

FIG. 16

0.50mm PITCH-LARGEST POSSIBLE MATRIX WITH N-1 ROW DEPOPULATED  
18UM RULE-LINE/SPACE  20/30  
25UM RULE-LINE/SPACE  28/42

| VIACAP RULE | 50 | um | OVERLAP OF VIACAP FROM EDGE OF VIA |
| --- | --- | --- | --- |
| BODY | 12 | mm | *ASSUMED RELATIVE TO STANDARD VIAS |
| MATRIX | 21 | | |
| BALL PITCH | 500 | um | TOTAL 256 |

| ROW N- | BALLSITES/ROW | BALLS DEPOP PER SIDE | REMAINING BALLS ON ROW | NUMBER OF REDUCED SIZE VIAS/SIDE | STANDARD VIA SIZE (um) | REDUCED VIA SIZE (um) | LINE WIDTH (um) | SPACE WIDTH (um) | TRACES BETWEEN STANDARD VIAS | TRACES PER REDUCED VIA | TRACES PER DEPOP BALL* | MAX TRACES (BALLS INSIDE) | MAX TRACES OK? | TOTAL POSSIBLE BALLS | ACTUAL BALLS INSIDE | DELTA |
| --- | --- | --- | --- | --- | --- | --- | --- | --- | --- | --- | --- | --- | --- | --- | --- | --- |
| 0 | 80 | 8 | 48 | 0 | 280 | 280 | 18 | 28 | 2 | 2 | 12 | 416 | 48 | 48 | 208 | 208 |
| 1 | 72 | 1 | 68 | 0 | 280 | 280 | 18 | 28 | 2 | 2 | 12 | 176 | 68 | 68 | 140 | 36 |
| 2 | 64 | 0 | 64 | 0 | 280 | 280 | 18 | 28 | 2 | 2 | 12 | 128 | 64 | 64 | 76 | 52 |
| 3 | 56 | 2 | 48 | 0 | 280 | 280 | 18 | 28 | 2 | 2 | 12 | 176 | 48 | 48 | 28 | 148 |
| 4 | 48 | 12 | 0 | 0 | 280 | 280 | 18 | 28 | 2 | 2 | 12 | 480 | 0 | 0 | 28 | 452 |
| 5 | 40 | 10 | 0 | 0 | 280 | 280 | 18 | 28 | 2 | 2 | 12 | 400 | 0 | 0 | 28 | 372 |
| 6 | 32 | 1 | 28 | 0 | 280 | 280 | 18 | 28 | 2 | 2 | 12 | 96 | 28 | 28 | 0 | 96 |
| 7 | 24 | 6 | 0 | 0 | 280 | 280 | 18 | 28 | 2 | 2 | 12 | 240 | 0 | 0 | 0 | 240 |
| 8 | 16 | 4 | 0 | 0 | 280 | 280 | 18 | 28 | 2 | 2 | 12 | 160 | 0 | 0 | 0 | 160 |
| 9 | 8 | 2 | 0 | 0 | 280 | 280 | 18 | 28 | 2 | 2 | 12 | 80 | 0 | 0 | 0 | 80 |
| 10 | 0 | 0 | 0 | 0 | | | | | | | | 0 | 0 | 0 | 0 | 0 |
| TOTAL 256 | | | | | | | | | | | | TRUE TOTAL 256 | | | | |

MODELING TECHNIQUE FOR SELECTIVELY DEPOPULATING ELECTRICAL CONTACTS FROM A FOOT PRINT OF A GRID ARRAY (BGA OR LGA) PACKAGE TO INCREASE DEVICE RELIABILITY

FIELD OF THE INVENTION

The present invention relates to the field of integrated circuit devices. More specifically, the present invention relates to a modeling technique for selectively depopulating electrical contacts from a foot print of a grid array (ball grid array (BGA) or land grid array (LGA)) package to increase the routability of the package substrate and increase the device reliability.

BACKGROUND OF THE INVENTION

The parallel drive towards total cost reduction and miniaturization has, in recent years, given rise to an increasing emphasis on very small IC package solutions. This is particularly evident in consumer based end equipment such as camcorders and mobile telephone handsets. Despite a formal definition, packages whose area is similar to that of the IC they encapsulate are loosely referred to as chip scale packages (CSPs).

CSPs are in many ways an ideal solution to the cost reduction and miniaturization requirement. They offer enormous area reductions compared with quad flat package, and have increasing potential to do so without adding system level cost. In the best case, CSPs are able to compete today, on a cost per terminal basis, with quad flat packages. For example, various CSPs from Texas Instruments are now available at cost parity with thin quad flat packages.

Texas Instruments produces a polyimide-based family of CSPs known as MicroStarBGA™ (see FIG. 1). This CSP 10, like most others, uses solder alloy balls 12 as the interconnection between the package substrate 14 and the board on which the packages is soldered. As with all such packages, the solder balls formed between the package and the board are susceptible to fatigue when exposed to cyclic ambient temperature conditions.

JEDEC and EIAJ are increasingly documenting fine pitch BGA industry standards. The finest pitch standard that is currently widely recognized is 0.50 mm pitch. However, broad acceptance and use of 0.50 mm pitch CSPs is still very limited, due to the following reasons:

1) Lack of package availability from a broad range of suppliers.
2) Lack of package reliability data, and concerns that reliability will not meet the requirements of even the consumer markets.
3) The printed circuit board (PCB) requirements for mounting such fine pitch packages are very demanding. There is limited availability of such boards, and in many cases, the higher PCB cost is prohibitive.
4) Lack of experience on the part of most SMT assembly operations in manufacturing with such fine pitch BGAs.
5) Belief that 0.50 mm pitch CSP component cost is inherently higher, on a cost per terminal basis, than for example, 0.80 mm pitch CSPs.

Clearly, key to the successful adoption of a package that has to meet the twin goals of system cost reduction and miniaturization, is the package reliability. As the ball pitch shrinks, it becomes more and more difficult to meet reliability specifications, due to the ball joint fatigue phenomenon mentioned in the introduction. Both the size (volume) and shape of the solder ball influence reliability. The weakest link in the system is normally the point of smallest cross-section in the solder joint, which is via (28), as seen in FIG. 2.

Thus a major challenge in the design of the CSP substrate is to optimize the diameter of this solder via. However, as the ball density on the package increases (more balls on more rows, at finer pitch), substrate routing density also increases, often leading to a package design of inherent lower reliability. To demonstrate this, the current optimum design for reliability, as shown in FIG. 3, is:

| | |
|---|---|
| Ball (12) pitch | 500 um |
| Line (30)/Space | 28/42 um |
| Via (32) diameter | 280 um |
| Solder ball pad (34) diameter | 380 um |

NB pad size is via size + 100 um.

These optimum rules, based on design for reliability, allow only one trace or line (30) to pass between adjacent balls (12). This is important since in CSP packages, since a line or trace (30) must extend from each solder ball pad (34) to an exterior edge of the substrate (14) (e.g., to facilitate electrolytic plating). Such restriction of limiting one line or trace between adjacent balls will limit the total number of balls that may actually be implemented in a matrix type ball grid array since there will be a limitation on how many traces or lines may actually extend out to an exterior surface of the substrate.

FIG. 4 discloses a conventional ball footprint (regular pattern of 3 row of balls) having 144 balls (on a 0.5 mm pitch) on a 10×10 mm package body. To achieve this dense routing, a designer has to compromise. There are typically three options:

1) Tighten the line/space design rule for the connection traces. This can add cost or may be beyond the capability of the substrate technology. *
2) Reduce the via diameter. This will reduce the fatigue life of the solder joint.
3) Reduce the minimum overlap of the ball pad to via (see FIG. 4). This has negative reliability implications, as it will effect the moisture sensitivity of the package.

* NB. The line/space design rules can be improved upon by reducing the copper film thickness. This will not be discussed since the principles explained here are applicable to enhance the package reliability for any given metal film thickness. The most common compromise, when faced with having to increase routing density, is to use the tightest line/space rule available for the given substrate technology, and then to reduce the ball via diameter. This is demonstrated in the example in FIG. 5, and is the design used for the footprint in FIG. 4.

FIG. 5 discloses a routing pattern for 3 full rows of balls, in which:

| | |
|---|---|
| Ball (12) pitch | 500 um |
| Line (30)/Space | 28/42 um |
| Via (32) diameter | 218 um |
| Solder ball pad (34) diameter | 318 um |

Thus, in the case of FIG. 4 (and by implication FIG. 5), the designer chose option 2. In order to allow two traces to route between adjacent balls, the via diameter had to be reduced from 280 um to 218 um, which is a violation of the optimum design rules which call for a via diameter of 280 um. There are significant reliability implications of such a modification or change, as is well known in the art.

SUMMARY OF THE INVENTION

A modeling technique for selectively depopulating solder contacts (and their respective contact pads, vias and traces or lines) from a conventional foot print of a grid array package (Ball Grid Array (BGA), or Land Grid Array (LGA)) to improve device reliability, and a BGA or LGA package so modeled. The modeling technique anticipates a routing of traces through the gap resulting from the depopulated solder contacts as additional space for routing traces or lines from solder contact pads to an exterior surface of a substrate (14) upon which a semiconductor die (20) is mounted. An advantage of the present invention is that it provides an easy to use modeling technique (e.g., in this case an Excel spreadsheet) that allows a user to easily predict whether or not a preselected number of balls on a specific body size device will be possible.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 7 illustrates the modeling results for the ball grid array footprint of FIGS. 5 and 6.

FIG. 10 illustrates the modeling results for the ball grid array footprint of FIG. 9.

FIG. 12 illustrates the modeling results for the ball grid array footprint of FIG. 11.

FIG. 14 illustrates the modeling results for the ball grid array footprint of FIG. 13.

FIG. 16 illustrates the modeling results for the ball grid array footprint of FIG. 15.

DETAILED DESCRIPTION OF THE INVENTION

Taking a radical look at footprint design, it is possible to overcome many of the restrictions and compromises discussed above. Using the principle of selective ball depopulation, it is possible to return to the optimum design rule for reliability and match the ball density of the conventional footprint design. However, the complexity of the footprint design has now increased significantly, especially as (as far as the author is aware) there are no available software design tools available today to handle this.

Figure 1:
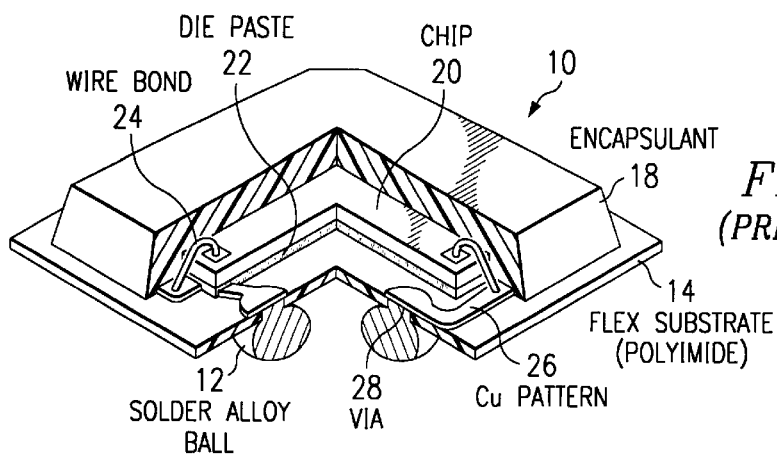
FIG. 1 is an exploded sectional view of a ball grid array (BGA) package.
Figure 2:
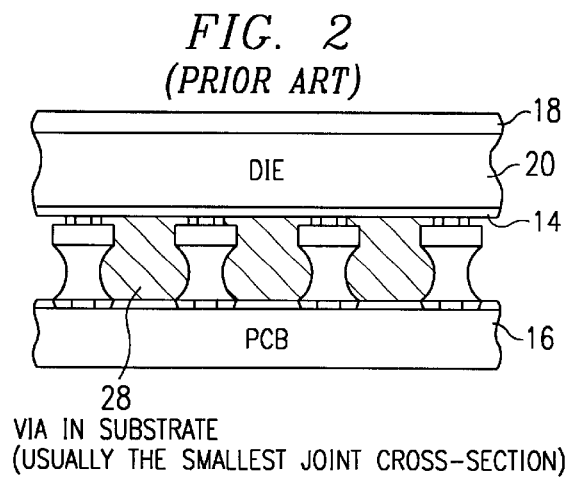
FIG. 2 is a cross sectional view of a ball grid array (BGA) package mounted on a printed wiring board (PWB).
Figure 3:
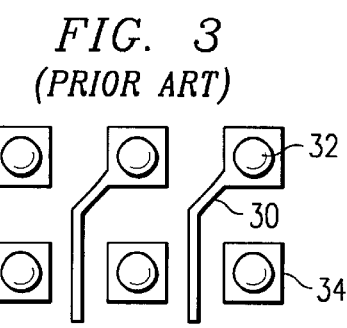
FIG. 3 illustrates the current optimum design for vias, solder ball pads and traces or lines.
Figure 4:
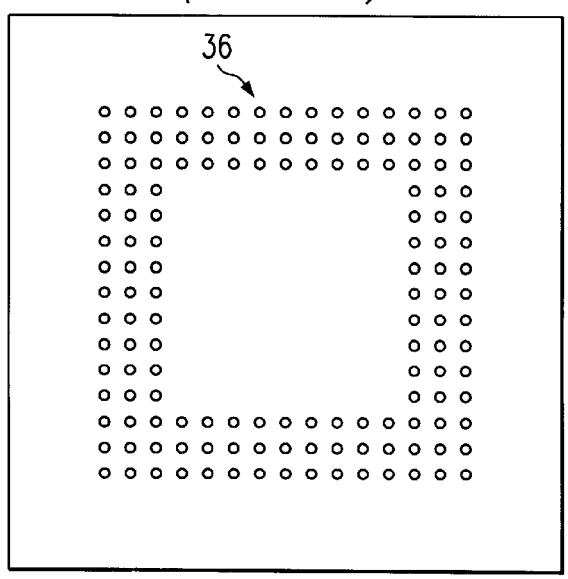
FIG. 4 illustrates a conventional ball grid array footprint that can be attained when current optimum design rules are compromised.
Figure 5:
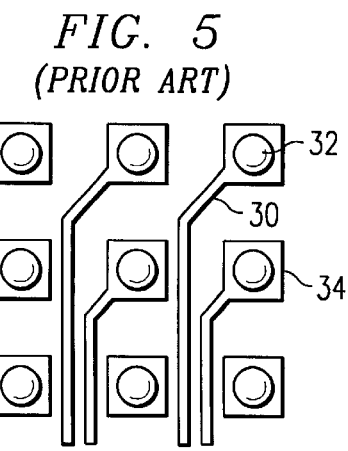
FIG. 5 illustrates a routing pattern for three full rows of balls in the ball grid array footprint of FIG. 4.

As shown in FIG. 3, a 280 um via (32) only permits one trace between adjacent balls (12). If however, we depopulate a ball (including its associated via (32), solder ball pad (34) and trace or line (30)), we can now place up to 8 traces or lines (30) when using the 25 um rule-line/space 28/42 (or up to 13 traces or lines (30) when using the 18 um rule-line/space 20/30—these numbers will change when other rule-line/space numbers are selected) in the resulting gap between 2 adjacent balls. By careful selection of these depopulated balls, it is possible to route as many, if not more total balls with the optimum design rule (optimum via diameter), as compared to the conventional footprint with compromised design rules (e.g., via diameter of less than 280 um). This design concept is called 'Smart-Foot'™.

Figure 6:
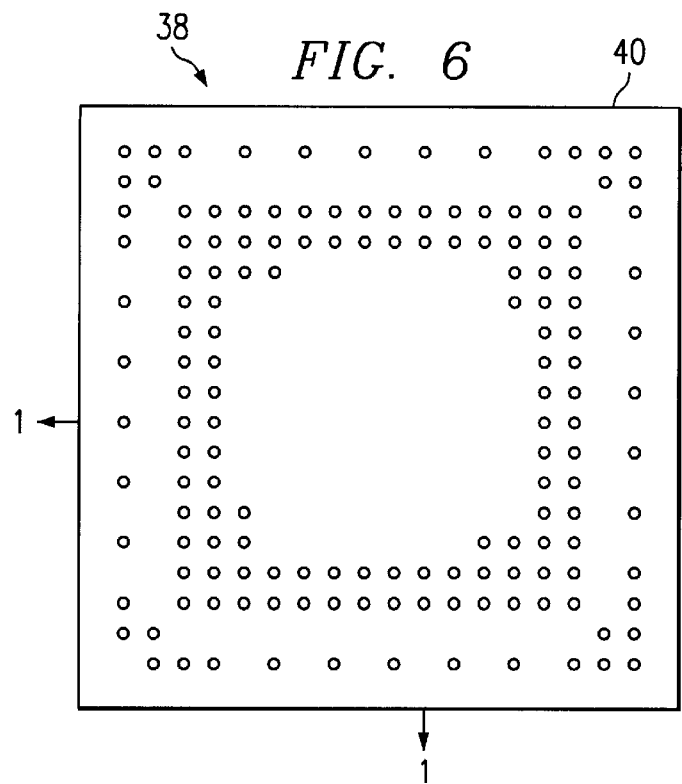
FIG. 6 illustrates a ball grid array footprint with selective ball depopulation, according to one embodiment of the invention.

FIG. 6 illustrates a footprint (38), with selective ball depopulation. More specifically, the selective ball depopulated footprint (38) shown in FIG. 6 is a footprint for the TI 151 GHZ uStarBGA™, package, which comprises 151 balls on a 10×10 mm body (40). FIG. 7 discloses an Excel spreadsheet incorporating a modeling technique that allows a package designer to quickly determine whether or not a preselected number of balls for a specific body size is feasible. In order for the modeling technique to work, there are some parameter that have to be preselected (or inserted into the spreadsheet's calculation rules) and others that can be entered "on the fly" by a designer. For example, in the case of FIG. 7, a 0.50 mm pitch is preselected which is the largest possible matrix with n−1 row depopulated. A Viacap rule of 50 um is also preselected which is an overlap of metal from the edge of the via. The body size parameter is one which a designer next selects "on the fly" (10 mm in the case of FIG. 7). The matrix parameter is also selected "on the fly" (18 in the case of FIG. 7). The Ball Pitch is preselected (500 um in the case of FIG. 7). Next, there are 17 vertical columns of information that must be filled in-most preselected, but a few "on the fly".

Column 1 is the "Row n−" column. It lists at least the total number of possible rows (four-sided) for the selected body size, starting with "row 0" as the outer most (and therefore largest) row and working up to "row n" as the inner most (and therefore smallest row). While 11 rows are listed (0–10), 9 are the most available in the case of FIG. 7. The total number of rows is preselected and will vary depending upon body size and matrix selected.

Column 2 is the "Ballsites/row" column. Column 2 lists the total possible number of ball sites available for each specific row. While the number for each row is initially preselected, the program will automatically change the numbers as the body and matrix number are changed "on the fly"

by a designer. In the case of FIG. 7 (10 mm body size and matrix of 18), row 0 lists 68 ball sites available. Each additional row lists a correspondingly reduced number of ball sites until row 8, which lists 4 ball sites available. Being that the spreadsheet was designed with substrate design rules in mind (knowledge available to one of ordinary skill in the art), these numbers are changed by the spreadsheet and not by a device designer.

Column 3 is the "Balls depopulated per side" of a four-sided row. These are selected by a designer "on the fly". A designer can select from 0 to a full ¼ of the total number of ball sites, to depopulate on each row.

Column 4 is the "Remaining balls on row" column which lists the total number of balls remaining in the respective four-sided row. While these numbers will be initially preselected to be the same as their respective "ballsites/row" assuming 0 balls depopulated per side, the spreadsheet will automatically change the numbers as a designer changes the numbers in Column 3 "on the fly".

Column 5 is the "Number of reduced size vias/Side". The numbers in this column are preselected by a designer should be 0 for each row having standard size vias. This number is preset by the design rules and will not change unless the designer prechooses a nonstandard via size.

Column 6 is the "Standard via size (um)" column. The numbers in this column are preselected by a designer and, currently, standards bodies have selected 280 um as being a standard size. This will not change unless the designer preselects another standard size.

Column 8 is the "Reduced via size (um)" column. The numbers in this column are preselected by a designer and, if reduced vias are to be used in conjunction with standard size vias, then the designer must prechoose the reduced size. If no reduced size vias are to be selected, then the number should be left the same as in Column 7.

Column 9 is the "Line width (um)" column. The numbers in this column are preselected by a designer and, if the 18 um copper rule is selected, the number placed in each row of column 9 is 18. If by change the 25 um copper rule is selected, 28 is the number placed in each row of column 9. While the current invention contemplates two rules to choose from, e.g., the 18 um and 25 um rules for line/space, other can also be used.

Column 10 is the "Space width (um)" column. The numbers in this column are preselected by a designer and, if the 18 um copper rule is selected, the number placed in each row of column 10 is 28. If, on the other hand, the 25 um copper rule is selected, 42 is the number placed in each row of column 10. While the current invention contemplates two rules to choose from, e.g., the 18 um and 25 um rules for line/space, other can also be used.

Column 11 is the "Traces between standard vias" column. The numbers in this column are preselected by a designer and, under currently accepted industry standards, if the 18 um line/space rule is selected, 2 is preselected and placed in each row of column 11. If, on the other hand, the 25 um line/space rule is selected, 1 is preselected and placed in each row of column 11. As above, this number may change for other line/spacing rules or as industry standards change.

Column 12 is the "Traces per depopulated ball" column. The numbers in this column are preselected by a designer and, under currently accepted industry spacing standards, if the 18 um rule is selected, up to 12 traces per depopulated ball are possible. If the 25 um line/spacing rule is selected, up to 8 traces per depopulated ball are possible. As above, this number may change for other line/spacing rules or as industry standards change.

Column 13 is the "Max traces (balls inside) column. This calculates the total number of metal traces that can be placed between the balls (with or without depopulation) on the given row. This equates to the maximum number of balls that can be placed on the sum of all the rows inside the given row.

Column 14 is the "Max Traces OK?" column. This checks that the number of allowable traces between the balls on the given column is sufficient to accommodate all the balls currently specified as present on the sum of the rows inside the given row. If not, a warning value of –99999 is calculated, resulting in a non-workable solution. If this non-workable solution is flagged, then more balls can be depopulated in column 3 until a workable solution is found.

Column 15 is the "Total Possible Balls" column. This shows the number of balls on the given row, if the result in column 14 is workable. If not, it shows the value zero, and subsequently indicates a non-workable total (zero) in the "TOTAL" cell.

Column 16 is the "Actual Balls Inside" column. This shows the total number of balls currently present inside the given row. This is compared to the theoretical maximum balls possible shown in column 13. If the actual is less than the theoretical maximum, this indicates a workable solution, and is used to calculate the difference between theoretical and actual in column 17.

Column 17 is the "Delta" column. This calculates the difference between the actual balls inside the given row, and the theoretical maximum number of balls possible inside the given row. The closer to zero, the more difficult the routing is likely to be.

Once all of the "preselected" parameters have been entered into the spreadsheet, a designer is free to enter and change numbers "on the fly" in the "Body", "Matrix" and "Balls depopulated per side (col. 3)", in order to predict the feasibility of the ball grid pattern selected by the designer. If a positive number comes up for the Total number of balls, then the pattern selected by the designer is possible. If, however, a "0" comes up for the Total number of balls, then the pattern selected by the designer is not possible using the preselected design parameters.

Referring back to FIG. 7, modeling for the TI 151 GHZ uStarBGA™, package began with the selection of a 10×10 mm body (based upon combination of size of die and size limitation request of customer). Next a ball grid matrix of 18 (18×18) was selected. Recall from the previous discussions that it is not possible to utilize a full 18×18 ball grid array having 324 balls (or any other grid of substantial size for that matter), using optimum design rules, since a trace or line for each viable die pad must extend to the outer surface of the substrate and there is not enough room between all of the 0.28 mm diameter vias to accommodate all of the traces. The trick is to intelligently decide which balls to depopulate in order to arrive at the desired footprint. So, in the embodiment of FIGS. 6 and 8, a standard size via of 280 um, a line width of 28 um—which allows one trace between standard vias and up to 8 traces between two vias having a depopulated via spaced therebetween.

Using the above criteria, the outer most row (row 0) on the gird (having four identical sides) has a maximum potential of 68 ball sites with 6 balls being depopulated on each of the four sides of the outermost row, resulting in a total number of 44 balls remaining for row 0. The next row in on the grid (row 1) has a maximum potential of 60 ball sites with 14 balls being depopulated on each of the four sides of the row, resulting in a total number of 4 balls remaining for row 1.

Figure 8:
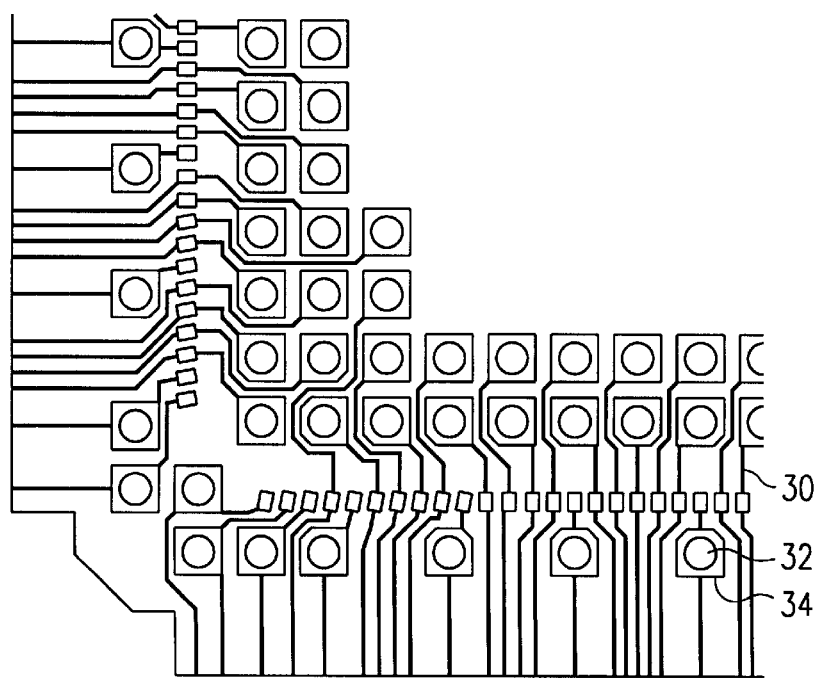
FIG. 8 illustrates a routing pattern of a portion of the footprint of FIG. 6.

The next row in on the grid (row 2) has a maximum potential of 52 ball sites with 0 balls being depopulated on each of the four sides of the row, resulting in a total number of 52 balls remaining on row 2. The next row in on the grid (row 3) has a maximum potential of 44 ball sites with 0 balls being depopulated on each of the four sides of the row, resulting in a total number of 44 balls remaining on row 3. The next row in on the grid (row 4) has a maximum potential of 36 ball sites with 7 balls being depopulated on each of the four sides of the row, resulting in a total number of 44 balls remaining on row 3. No additional rows of ball were selected. Adding all of the balls together results in a package having a footprint with 152 balls (reduced to 151 balls when the ball in the lower left had corner of row 0 is depopulated), as can be seen in FIG. 7, which illustrates the results of the selection for this footprint. In this example, the 151 balls actually selected are not the maximum or minimum that can be obtained for a 10×10 mm package using the selective depopulation of the present invention. Nevertheless, 151 balls is substantially more than can be obtained on a 10×10 mm package using conventional footprint design techniques requiring the optimum 280 um via size. FIG. 8 illustrates a routing pattern of a portion of the footprint of FIG. 6 along section lines 1—1. The spreadsheet indicates in fact that up to 248 balls could be routed with 280 um vias if required (by depopulating on rows 0–5, 6,5,4,2,1 and 1 balls respectively).

Figure 9:
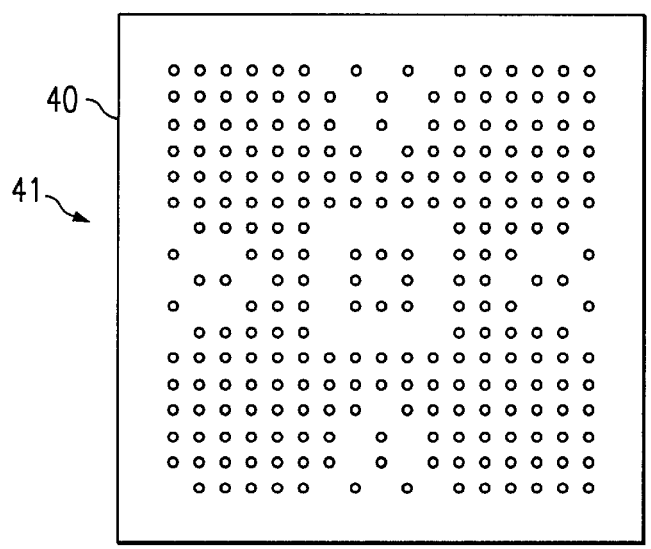
FIG. 9 illustrates a ball grid array footprint with selective ball depopulation, according to another embodiment of the invention.

FIG. 9 illustrates another footprint (41), with selective ball depopulation. More specifically, the selective ball depopulated footprint (41) shown in FIG. 9 is a footprint for the TI 240 GHZ uStarBGA™, package, which comprises 240 balls on a 10×10 mm body (40). The TI 240 GHZ uStarBGA™, package modeling began with the selection of a 10×10 mm body (based upon combination of size of die and size limitation request of customer). Next a ball grid matrix of 17 (17×17) was selected. In the embodiment of FIG. 9, a standard size via of 280 um, a line width of 18 um (less than current optimum design rules)—which allows two traces between standard vias and up to 12 traces between two vias having a depopulated via spaced therebetween.

Using the above criteria, the outer most row (row 0) on the gird (having four identical sides) has a maximum potential of 64 ball sites with 3 balls being depopulated on each of the four sides of the outermost row, resulting in a total number of 52 balls remaining for row 0. The next row in on the grid (row 1) has a maximum potential of 56 ball sites with 2 balls being depopulated on each of the four sides of the row, resulting in a total number of 48 balls remaining for row 1. The next row in on the grid (row 2) has a maximum potential of 48 ball sites with 2 balls being depopulated on each of the four sides of the row, resulting in a total number of 40 balls remaining on row 2. The next row in on the grid (row 3) has a maximum potential of 40 ball sites with 1 ball being depopulated on each of the four sides of the row, resulting in a total number of 36 balls remaining on row 3. The next row in on the grid (row 4) has a maximum potential of 32 ball sites with 0 balls being depopulated on each of the four sides of the row, resulting in a total number of 32 balls remaining on row 4. The next row in on the grid (row 5) has a maximum potential of 24 ball sites with 0 balls being depopulated on each of the four sides of the row, resulting in a total number of 24 balls remaining on row 5. The next row in on the grid (row 6) has a maximum potential of 16 ball sites with 4 balls being depopulated on each of the four sides of the row, resulting in a total number of 0 balls remaining on row 6. The next row in on the grid (row 7) has a maximum potential of 8 ball sites with 0 balls being depopulated on each of the four sides of the row, resulting in a total number of 8 balls remaining on row 7. No additional rows of ball were selected. Adding all of the balls together results in a package having a footprint with 240 balls, as can be seen in FIG. 10, which illustrates the results of the selection for this footprint. As the above-described 151 ball footprint example, the 240 balls actually selected are not the maximum or minimum that can be obtained for a 10×10 mm package using the selective depopulation of the present invention. As above, 240 balls is substantially more than can be obtained on a 10×10 mm package using conventional footprint design techniques requiring the optimum 280 um via size.

Figure 11:
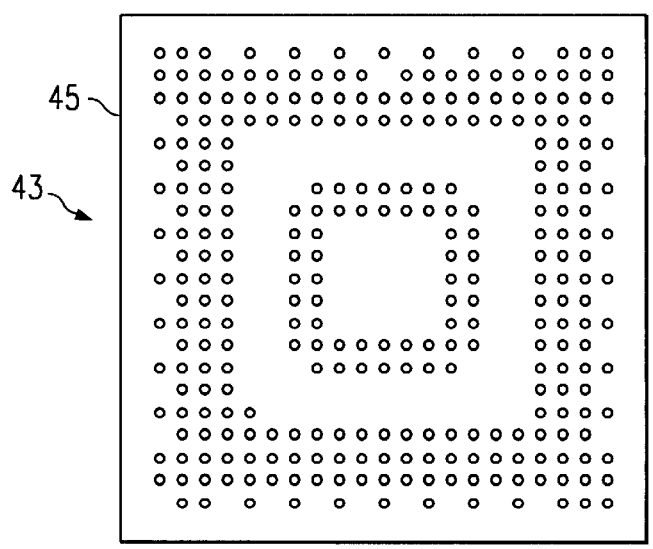
FIG. 11 illustrates a ball grid array footprint with selective ball depopulation, according to yet another embodiment of the invention.

FIG. 11 illustrates yet another footprint (43), with selective ball depopulation. More specifically, the selective ball depopulated footprint (43) shown in FIG. 11 is a footprint for the TI 288 GZG uStarBGA™, package, which comprises 288 balls on a 12×12 mm body (45). The TI 288 GZG uStarBGA™, package modeling began with the selection of a 12×12 mm body (based upon combination of size of die and size limitation request of customer). Next a ball grid matrix of 21 (21×21) was selected. In the embodiment of FIG. 11, a standard size via of 280 um, a line width of 18 um (less than current optimum design rules)—which allows two traces between standard vias and up to 12 traces between two vias having a depopulated via spaced therebetween.

Using the above criteria, the outer most row (row 0) on the gird (having four identical sides) has a maximum potential of 80 ball sites with 8 balls being depopulated on each of the four sides of the outermost row, resulting in a total number of 48 balls remaining for row 0. The next row in on the grid (row 1) has a maximum potential of 72 ball sites with 1 ball being depopulated on each of the four sides of the row, resulting in a total number of 68 balls remaining for row 1. The next row in on the grid (row 2) has a maximum potential of 64 ball sites with 0 balls being depopulated on each of the four sides of the row, resulting in a total number of 64 ball s remaining on row 2. The next row in on the grid (row 3) has a maximum potential of 56 ball sites with 0 balls being depopulated on each of the four sides of the row, resulting in a total number of 56 balls remaining on row 3. The next row in on the grid (row 4) has a maximum potential of 48 ball sites with 12 balls being depopulated on each of the four sides of the row, resulting in a total number of 0 balls remaining on row 4. The next row in on the grid (row 5) has a maximum potential of 40 ball sites with 10 balls being depopulated on each of the four sides of the row, resulting in a total number of 0 balls remaining on row 5. The next row in on the grid (row 6) has a maximum potential of 32 ball sites with 1 ball being depopulated on each of the four sides of the row, resulting in a total number of 28 balls remaining on row 6. The next row in on the grid (row 7) has a maximum potential of 24 ball sites with 0 balls being depopulated on each of the four sides of the row, resulting in a total number of 24 balls remaining on row 7. The next row in on the grid (row 8) has a maximum potential of 16 ball sites with 4 balls being depopulated on each of the four sides of the row, resulting in a total number of 0 balls remaining on row 8. The next row in on the grid (row 9) has a maximum potential of 8 ball sites with 2 balls being depopulated on each of the four sides of the row, resulting in a total number of 0 balls remaining on row 9. No additional rows of ball were selected. Adding all of the balls together results in a package having a footprint with 288 balls, as can be seen in FIG. 12, which illustrates the results of the selection for this footprint. The 288 balls actually selected are not the maximum or minimum that can be obtained for a 12×12 mm package using the selective depopulation of the present invention. As above, 288 balls is substantially more than can be obtained on a 12×12 mm package using conventional footprint design techniques requiring the optimum 280 um via size.

Figure 13:
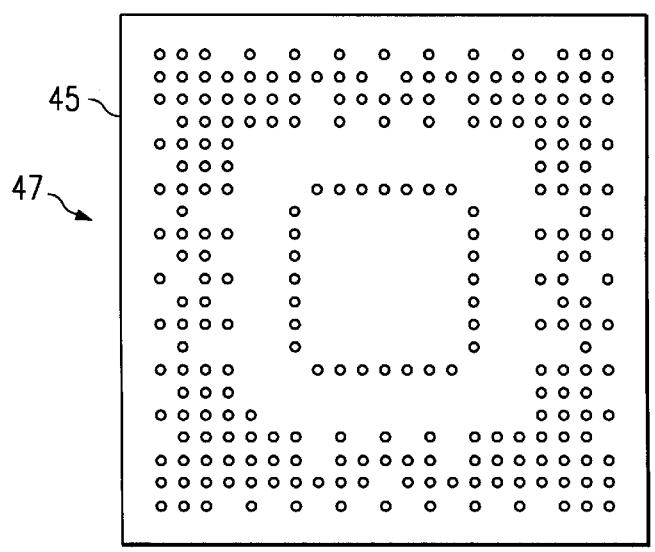
FIG. 13 illustrates a ball grid array footprint with selective ball depopulation, according to still another embodiment of the invention.

FIG. 13 illustrates still another footprint (47), with selective ball depopulation. More specifically, the selective ball depopulated footprint (47) shown in FIG. 11 is a footprint for the TI 240 GZG uStarBGA™, package, which comprises 240 balls on a 12×12 mm body (45). The TI 240 GZG uStarBGA™, package modeling began with the selection of a 12×12 mm body (based upon combination of size of die and size limitation request of customer). Next a ball grid matrix of 21 (21×21) was selected. In the embodiment of FIG. 13, a standard size via of 280 um, a line width of 18 um (less than current optimum design rules)—which allows two traces between standard vias and up to 12 traces between two vias having a depopulated via spaced therebetween.

Using the above criteria, the outer most row (row 0) on the gird (having four identical sides) has a maximum potential of 80 ball sites with 8 balls being depopulated on each of the four sides of the outermost row, resulting in a total number of 48 balls remaining for row 0. The next row in on the grid (row 1) has a maximum potential of 72 ball sites with 1 ball being depopulated on each of the four sides of the row, resulting in a total number of 68 balls remaining for row 1. The next row in on the grid (row 2) has a maximum potential of 64 ball sites with 2 balls being depopulated on each of the four sides of the row, resulting in a total number of 56 balls remaining on row 2. The next row in on the grid (row 3) has a maximum potential of 56 ball sites with 4 balls being depopulated on each of the four sides of the row, resulting in a total number of 40 balls remaining on row 3. The next row in on the grid (row 4) has a maximum potential of 48 ball sites with 12 balls being depopulated on each of the four sides of the row, resulting in a total number of 0 balls remaining on row 4. The next row in on the grid (row 5) has a maximum potential of 40 ball sites with 10 balls being depopulated on each of the four sides of the row, resulting in a total number of 0 balls remaining on row 5. The next row in on the grid (row 6) has a maximum potential of 32 ball sites with 1 ball being depopulated on each of the four sides of the row, resulting in a total number of 28 balls remaining on row 6. The next row in on the grid (row 7) has a maximum potential of 24 ball sites with 6 balls being depopulated on each of the four sides of the row, resulting in a total number of 0 balls remaining on row 7. The next row in on the grid (row 8) has a maximum potential of 16 ball sites with 4 balls being depopulated on each of the four sides of the row, resulting in a total number of 0 balls remaining on row 8. The next row in on the grid (row 9) has a maximum potential of 8 ball sites with 2 balls being depopulated on each of the four sides of the row, resulting in a total number of 0 balls remaining on row 9. No additional rows of ball were selected. Adding all of the balls together results in a package having a footprint with 240 balls, as can be seen in FIG. 14, which illustrates the results of the selection for this footprint. The 240 balls actually selected are not the maximum or minimum that can be obtained for a 12×12 mm package using the selective depopulation of the present invention. As above, 240 balls is substantially more than can be obtained on a 12×12 mm package using conventional footprint design techniques requiring the optimum 280 um via size.

Figure 15:
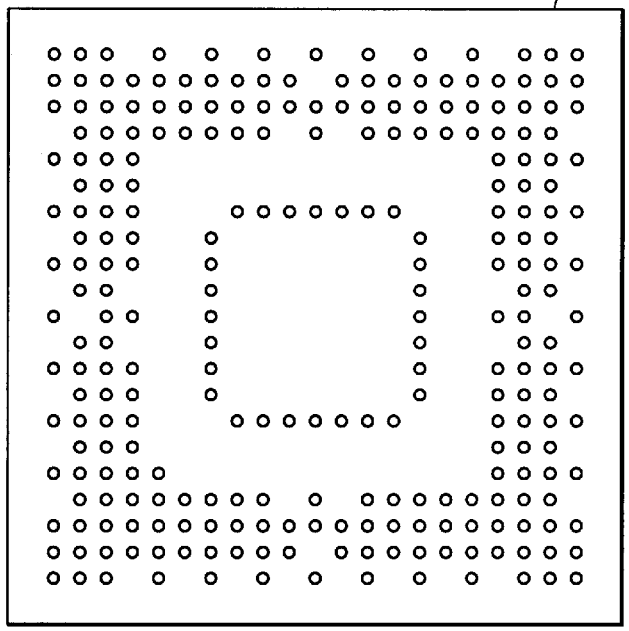
FIG. 15 illustrates a ball grid array footprint with selective ball depopulation, according to still yet another embodiment of the invention.

FIG. 15 illustrates still yet another footprint (49), with selective ball depopulation. More specifically, the selective ball depopulated footprint (49) shown in FIG. 15 is a footprint for the TI 256 GZG uStarBGA™, package, which comprises 256 balls on a 12×12 mm body (45). The TI 256 GZG uStarBGA™, package modeling began with the selection of a 12×12 mm body (based upon combination of size of die and size limitation request of customer). Next a ball grid matrix of 21 (21×21) was selected. In the embodiment of FIG. 15, a standard size via of 280 um, a line width of 18 um (less than current optimum design rules)—which allows two traces between standard vias and up to 12 traces between two vias having a depopulated via spaced therebetween.

Using the above criteria, the outer most row (row 0) on the gird (having four identical sides) has a maximum potential of 80 ball sites with 8 balls being depopulated on each of the four sides of the outermost row, resulting in a total number of 48 balls remaining for row 0. The next row in on the grid (row 1) has a maximum potential of 72 ball sites with 1 ball being depopulated on each of the four sides of the row, resulting in a total number of 68 balls remaining for row 1. The next row in on the grid (row 2) has a maximum potential of 64 ball sites with 0 balls being depopulated on each of the four sides of the row, resulting in a total number of 64 balls remaining on row 2. The next row in on the grid (row 3) has a maximum potential of 56 ball sites with 2 balls being depopulated on each of the four sides of the row, resulting in a total number of 48 balls remaining on row 3. The next row in on the grid (row 4) has a maximum potential of 48 ball sites with 12 balls being depopulated on each of the four sides of the row, resulting in a total number of 0 balls remaining on row 4. The next row in on the grid (row 5) has a maximum potential of 40 ball sites with 10 balls being depopulated on each of the four sides of the row, resulting in a total number of 0 balls remaining on row 5. The next row in on the grid (row 6) has a maximum potential of 32 ball sites with 1 ball being depopulated on each of the four sides of the row, resulting in a total number of 28 balls remaining on row 6. The next row in on the grid (row 7) has a maximum potential of 24 ball sites with 6 balls being depopulated on each of the four sides of the row, resulting in a total number of 0 balls remaining on row 7. The next row in on the grid (row 8) has a maximum potential of 16 ball sites with 4 balls being depopulated on each of the four sides of the row, resulting in a total number of 0 balls remaining on row 8. The next row in on the grid (row 9) has a maximum potential of 8 ball sites with 2 balls being depopulated on each of the four sides of the row, resulting in a total number of 0 balls remaining on row 9. No additional rows of ball were selected. Adding all of the balls together results in a package having a footprint with 256 balls, as can be seen in FIG. 16, which illustrates the results of the selection for this footprint. The 256 balls actually selected are not the maximum or minimum that can be obtained for a 12×12 mm package using the selective depopulation of the present invention. As above, 256 balls is substantially more than can be obtained on a 12×12 mm package using conventional footprint design techniques requiring the optimum 280 um via size.

Table 1 shows the results of the board level reliability (BLR) tests done on both the conventional and 'smart footprints'. Due to the heavy dependence of die size on reliability, the die in both cases was kept constant (6.0×6.0 mm). In order to focus on the package reliability, only failures in the package side of the joint are reported:

Board level reliability of conventional and 'Smart-Foot'™ packages.

TABLE 1

| | Via Diameter (mm) | Sample Size | Cycles to first failure |
|---|---|---|---|
| Conventional Footprint | 0.212 | 28 | 550 |
| 'Smart-Foot' ™ Footprint | 0.280 | 31 | 1450 |

Other design and test features used for this test are as follows:

| | |
|---|---|
| Temperature range | −40/125 deg C. |
| Ramp time | 2–5 minutes |
| Dwell time | 11–13 minutes |
| Board land type | Copper, Ni/Au plated |
| Board material | FR4 |
| Board thickness | 0.80 mm |
| Land design | Non-soldermask defined |
| Land diameter | 0.20 mm* |

*Optimum diameter is 0.25–0.30 mm. The boards procured for this test did not meet the original specification.

Figure 17:
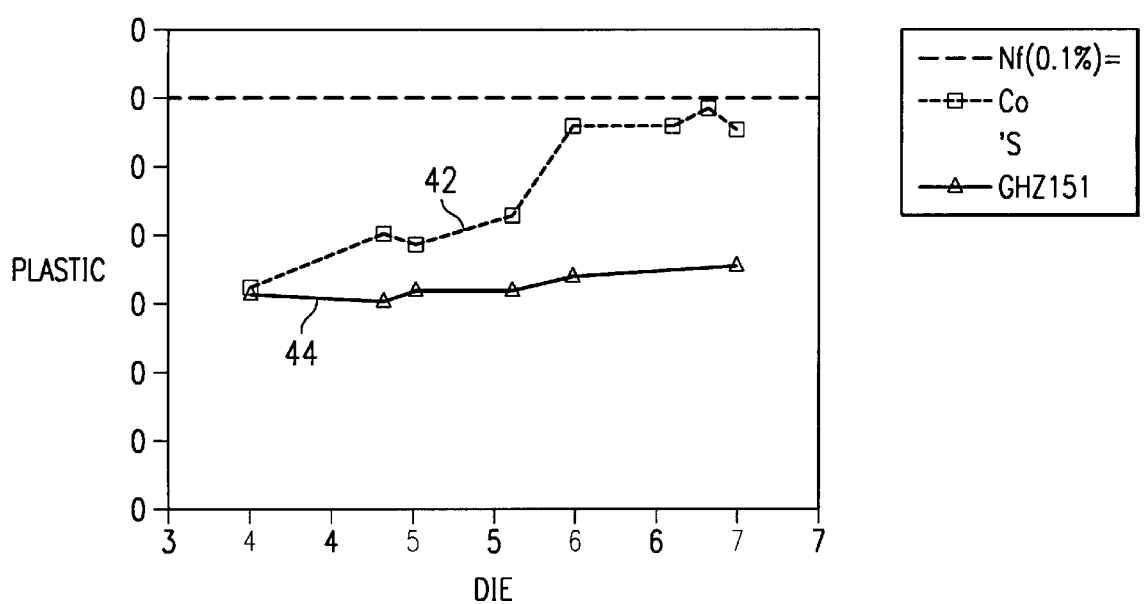
FIG. 17 illustrates a worst case elastic strain prediction for conventional ball grid array and selectively depopulated ball grid array packages as a function of die size.

The ability to model proposed solutions is invaluable in bringing new packages to market quickly. The TI 151 CSP 'Smart-Foot'™ packages was modeled using a two-dimensional finite element analysis tool before any new tooling was committed. The model confirmed the proposed reliability benefit in advance. The 151 ball CSP 'Smart-Foot'™ package not only proved as reliable as the model predicted, but all reliability tests passed first time. FIG. 17 shows the worst case elastic strain prediction for both packages as a function of die size, and clearly shows a much lower strain in the case of the 'Smart-Foot'™ package.

Custom DSPs for wireless handsets frequently use packages with 144 contacts. The 144 TQFP package has been a high running package for these applications. As discussed in the Background, there is a clear need to reduce the size of traditional QFP packages to equivalent chip scale packages. Thus a 144 CSP was required. A 12×12 mm body 144 CSP with 0.80 mm ball pitch as been developed, and has been a high running CSP since 1997. As further package shrinks were required, the 0.50 mm pitch version, with a 10×10 mm body size needed to be developed. Today, 10×10 mm body packages with 0.50 mm pitch are available with both conventional and 'Smart-Foot'™ footprints.

As the need for smaller bodied packages continues, we will see more package designs following this innovative path. Already, 12×12 mm and 13×13 mm body 'Smart-Foot'™ packages are being designed for applications with higher total ball count.

With a somewhat 'custom' approach to package design, various criticisms can be anticipated:

1) That 'Smart-Foot'™ packages look unconventional, and do not conform to the footprints offered by other vendors. Fortunately, due to the high volume of Wireless applications, a somewhat 'custom' footprint is easily justified in the context of the reliability benefits.
2) That the board routability of such unusual footprints may be a problem. Actually, there is no added system cost penalty with this approach since routing of the 'Smart-Foot'™ footprint may actually be easier because of the spread out configuration. In the case of larger packages, such as 240 and 304 balls, additional care is necessary to ensure that board routability is not degraded, but such is easily accomplished.
3) That package cost will be higher. Other than a longer design cycle, cost of the 'Smart-Foot'™ packages is identical to packages with conventional footprints. The assembly processes are identical. The package materials used are the same in both cases. Furthermore there are examples where the 'Smart-Foot'™ avoids the use of higher cost substrate materials (requiring for example, two metal layers rather than the conventional one metal layer).
4) That there may be other additional system costs, other than the routability issue mentioned above. CSPs with inadequate reliability normally require the board assembler to add features to compensate for the package inadequacy. This normally involves an 'underfill' process, which is a method of using a glue between the component and the board. This glue relieves the stress from the solder balls, and distributes it across the entire surface area beneath the package. This is an effective technique, but adds significant cost. Thus use of higher reliability solutions such as the 'Smart-Foot'™ can save system level cost.

In conclusion, taking an innovative approach to package design using a 'Smart-Foot'™ package can provide several benefits.

1) A board level reliability improvement of 2–3 times that of conventional designs.
2) Potential for cost saving by avoiding additional processes such as underfill.
3) No additional costs are created for the package, the customer's board, or the customer's process.

What is claimed is:

1. A modeling technique for selectively depopulating solder balls and their respective solder ball pads, vias and traces or lines from anywhere on a conventional foot print of a grid array package to improve device reliability, wherein said technique utilizes a spreadsheet to predict the practicality of a selected foot print for a grid array having selectively depopulated contacts and their respective contact pads, vias and traces or lines.

2. The modeling technique of claim 1, wherein said grid array package is a ball grid array package.

3. A modeling technique for selectively depopulating solder balls and their respective solder ball pads, vias and traces or lines from anywhere on a conventional foot print of a grid array package to improve device reliability, wherein said technique utilizes an automated process to predict the practicality of a selected foot print for a grid array having selectively depopulated contacts and their respective contact pads, vias and traces or lines.

4. The modeling technique of claim 3, wherein said grid array package is a ball grid array package.

5. A modeling technique for selectively depopulating solder balls and their respective solder ball pads, vias and traces or lines from anywhere on a conventional foot print of a grid array package to improve device reliability, wherein a user of said technique can selectively vary the anticipated body size of a substrate in said grid array package.

6. The modeling technique of claim 5, wherein said grid array package is a ball grid array package.

7. A modeling technique for selectively depopulating solder balls and their respective solder ball pads, vias and traces or lines from anywhere on a conventional foot print of a grid array package to improve device reliability, wherein a user of said technique can selectively vary the anticipated matrix of contact sites in said ball grid array package.

8. The modeling technique of claim 7, wherein said grid array package is a ball grid array package.

9. A modeling technique for selectively depopulating solder balls and their respective solder ball pads, vias and traces or lines from anywhere on a conventional foot print of a grid array package to improve device reliability, wherein a user of said technique can selectively vary the number of balls he anticipates depopulating from each side of a row in order to affect the total number of contact sites on a selected grid array package.

10. The modeling technique of claim 9, wherein said grid array package is a ball grid array package.

11. A modeling technique for selectively depopulating electrical contacts and their respective vias and traces or lines from anywhere on a conventional foot print of a gird array package to improve device reliability, wherein said technique utilizes a spreadsheet to predict the practicality of a selected foot print for a grid array having selectively depopulated contacts and their respective contact pads, vias and traces or lines.

12. The modeling technique of claim 11, wherein said grid array package is a land grid array package.

13. A modeling technique for selectively depopulating electrical contacts and their respective vias and traces or lines from anywhere on a conventional foot print of a gird array package to improve device reliability, wherein said technique utilizes an automated process to predict the practicality of a selected foot print for a grid array having selectively depopulated contacts and their respective contact pads, vias and traces or lines.

14. The modeling technique of claim 13, wherein said grid array package is a land grid array package.

15. A modeling technique for selectively depopulating electrical contacts and their respective vias and traces or lines from anywhere on a conventional foot print of a gird array package to improve device reliability, wherein a user of said technique can selectively vary the anticipated body size of a substrate in said grid array package.

16. The modeling technique of claim 15, wherein said grid array package is a land grid array package.

17. A modeling technique for selectively depopulating electrical contacts and their respective vias and traces or lines from anywhere on a conventional foot print of a gird array package to improve device reliability, wherein a user of said technique can selectively vary the anticipated matrix of contact sites in said ball grid array package.

18. The modeling technique of claim 17, wherein said grid array package is a land grid array package.

19. A modeling technique for selectively depopulating electrical contacts and their respective vias and traces or lines from anywhere on a conventional foot print of a gird array package to improve device reliability, wherein a user of said technique can selectively vary the number of electrical contacts he anticipates depopulating from each side of a row in order to affect the total number of contact sites on a selected grid array package.

20. The modeling technique of claim 19, wherein said grid array package is a land grid array package.

21. A modeling technique for selectively depopulating electrical contacts and their respective vias and traces or lines from anywhere on a conventional foot print of a ball grid array package to improve device reliability, wherein a user of said technique can selectively vary the number of electrical contacts he anticipates depopulating from said foot print.

22. A modeling technique for selectively depopulating solder balls and their respective solder ball pads, vias and traces or lines from anywhere on a conventional foot print of a grid array package to improve the package substrate routability, wherein said technique utilizes a spreadsheet to predict the practicality of a selected foot print for a grid array having selectively depopulated contacts and their respective contact pads, vias and traces or lines.

23. The modeling technique of claim 22, wherein said grid array package is a ball grid array package.

24. A modeling technique for selectively depopulating solder balls and their respective solder ball pads, vias and traces or lines from anywhere on a conventional foot print of a grid array package to improve the package substrate routability, wherein said technique utilizes an automated process to predict the practicality of a selected foot print for a grid array having selectively depopulated contacts and their respective contact pads, vias and traces or lines.

25. The modeling technique of claim 24, wherein said grid array package is a ball grid array package.

26. A modeling technique for selectively depopulating solder balls and their respective solder ball pads, vias and traces or lines from anywhere on a conventional foot print of a grid array package to improve the package substrate routability, wherein a user of said technique can selectively vary the anticipated body size of a substrate in said grid array package.

27. The modeling technique of claim 26, wherein said grid array package is a ball grid array package.

28. A modeling technique for selectively depopulating solder balls and their respective solder ball pads, vias and traces or lines from anywhere on a conventional foot print of a grid array package to improve the package substrate routability, wherein a user of said technique can selectively vary the anticipated matrix of contact sites in said grid array package.

29. The modeling technique of claim 28, wherein said grid array package is a ball grid array package.

30. A modeling technique for selectively depopulating solder balls and their respective solder ball pads, vias and traces or lines from anywhere on a conventional foot print of a grid array package to improve the package substrate routability, wherein a user of said technique can selectively vary the number of balls he anticipates depopulating from each side of a row in order to affect the total number of contact sites on a selected grid array package.

31. The modeling technique of claim 30, wherein said grid array package is a ball grid array package.

* * * * *